US012644178B2

(12) United States Patent
Tang et al.

(10) Patent No.: US 12,644,178 B2
(45) Date of Patent: Jun. 2, 2026

(54) LAYER DEPOSITION WITH POST-DEPOSITION AGGLOMERATION MITIGATION

(71) Applicant: ASM IP Holding B.V., Almere (NL)

(72) Inventors: Fu Tang, Gilbert, AZ (US); Eric Jen Cheng Liu, Tempe, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 205 days.

(21) Appl. No.: 18/402,243

(22) Filed: Jan. 2, 2024

(65) Prior Publication Data

US 2024/0229233 A1 Jul. 11, 2024

Related U.S. Application Data

(60) Provisional application No. 63/478,511, filed on Jan. 5, 2023.

(51) Int. Cl.
| | |
|---|---|
| *C23C 16/40* | (2006.01) |
| *C23C 16/44* | (2006.01) |
| *C23C 16/448* | (2006.01) |
| *C23C 16/455* | (2006.01) |

(52) U.S. Cl.
CPC .......... *C23C 16/407* (2013.01); *C23C 16/403* (2013.01); *C23C 16/4408* (2013.01); *C23C 16/448* (2013.01); *C23C 16/45553* (2013.01)

(58) Field of Classification Search
CPC . C23C 16/407; C23C 16/403; C23C 16/4408; C23C 16/448; C23C 16/45553
See application file for complete search history.

(56) References Cited

U.S. PATENT DOCUMENTS

| | | |
|---|---|---|
| 6,568,581 B2 | 5/2003 | Boller |
| 7,081,271 B2 | 7/2006 | Chung |

(Continued)

FOREIGN PATENT DOCUMENTS

| | | | | |
|---|---|---|---|---|
| CN | 103804963 A | * | 5/2014 | ............... C09C 3/06 |
| CN | 108486550 A | * | 9/2018 | ........... C23C 16/455 |

(Continued)

OTHER PUBLICATIONS

Weckman, Timo, et al., "Atomic Layer Deposition of Zinc Oxide: Diethyl Zinc Reactions and Surface Saturation from First-Principles". J. Phys. Chem. C 2016, 120, 21460-21471.*

(Continued)

*Primary Examiner* — Bret P Chen
(74) *Attorney, Agent, or Firm* — Snell & Wilmer L.L.P.

(57) ABSTRACT

A method can comprise providing a zinc precursor to a reaction chamber comprising a substrate disposed therein; providing an oxygen species to the reaction chamber; forming a zinc oxide layer on the substrate in response to providing the zinc precursor and providing the oxygen species; and/or mitigating agglomeration of the zinc oxide layer. Mitigating agglomeration of the zinc oxide layer can comprise forming a capping layer on an outer surface of the zinc oxide layer such that the outer surface of the zinc oxide layer is not exposed to ambient oxygen, doping the zinc oxide layer with another material, and/or applying a post-deposition treatment to the zinc oxide layer.

20 Claims, 5 Drawing Sheets

(56) References Cited

U.S. PATENT DOCUMENTS

| | | | |
|---|---|---|---|
| 7,625,794 B2 * | 12/2009 | Ahn | C23C 16/40 |
| | | | 438/785 |
| 7,772,097 B2 | 8/2010 | Tomasini | |
| 8,951,615 B2 | 2/2015 | Elam | |
| 10,256,126 B2 | 4/2019 | Finlay | |
| 10,600,643 B2 | 3/2020 | Park | |
| 11,495,459 B2 * | 11/2022 | Barbosa Lima | H10D 62/834 |
| 11,521,851 B2 | 12/2022 | Shero | |
| 2003/0168001 A1 * | 9/2003 | Sneh | C23C 16/02 |
| | | | 117/86 |
| 2008/0242097 A1 | 10/2008 | Boescke | |
| 2009/0246931 A1 | 10/2009 | Huotari | |
| 2010/0062149 A1 | 3/2010 | Ma | |
| 2011/0155984 A1 * | 6/2011 | Redaelli | H10B 63/80 |
| | | | 257/E47.001 |
| 2012/0021898 A1 * | 1/2012 | Elam | B01J 21/066 |
| | | | 502/439 |
| 2013/0146134 A1 * | 6/2013 | Hsiao | H10F 77/247 |
| | | | 257/E31.124 |
| 2014/0210835 A1 * | 7/2014 | Hong | H10D 84/038 |
| | | | 345/530 |
| 2021/0043869 A1 * | 2/2021 | Choi | H10K 50/115 |
| 2021/0327715 A1 | 10/2021 | Xie | |
| 2021/0332476 A1 | 10/2021 | Homm Jara | |
| 2021/0335612 A1 | 10/2021 | Deminskyi | |
| 2021/0335615 A1 | 10/2021 | Pierreux | |
| 2021/0348267 A1 | 11/2021 | Dezelah | |
| 2022/0123131 A1 | 4/2022 | Madia | |
| 2022/0165575 A1 | 5/2022 | Xie | |
| 2022/0285146 A1 | 9/2022 | Alessio Verni | |
| 2022/0285147 A1 | 9/2022 | Chen | |
| 2023/0197796 A1 | 6/2023 | Fu | |
| 2023/0215728 A1 | 7/2023 | Ma | |
| 2023/0386846 A1 | 11/2023 | Dezelah | |
| 2023/0386934 A1 | 11/2023 | Deng | |

FOREIGN PATENT DOCUMENTS

| | | | | |
|---|---|---|---|---|
| JP | 8-9784 | * | 1/1996 | C23C 16/30 |
| KR | 10-2022-0050784 | * | 4/2022 | H01L 29/51 |
| WO | WO 2015/107476 A1 | * | 7/2015 | C23C 16/40 |
| WO | WO 2019090805 A1 | * | 5/2019 | H01M 4/36 |

OTHER PUBLICATIONS

Van Toan, Nguyen, et al., "Aluminum doped zinc oxide deposited by atomic layer deposition and its applications to micro/nano devices". Scientific Reports (2021) 11:1204, pp. 1-12.*

Jeong, Kwang Seok, et al., "Effect of Al2O3 Capping Layer in ZnO TFT Fabricated by Atomic Layer Deposition". Advanced Materials Research, vol. 658, 2013, pp. 108-111. Abstract Only.*

Van Toan, Nguyen, et al., "Aluminum doped zinc oxide deposited by atomic layer deposition and its applications to micro/nano devices". Scientific Reorts (2011) 11:1204, pp. 1-12.*

* cited by examiner

400

LAYER DEPOSITION WITH POST-DEPOSITION AGGLOMERATION MITIGATION

CROSS-REFERENCE TO RELATED APPLICATIONS

This application is a nonprovisional of, and claims priority to and the benefit of, U.S. Provisional Patent Application No. 63/478,511, filed Jan. 5, 2023 and entitled "LAYER DEPOSITION WITH POST-DEPOSITION AGGLOMERATION MITIGATION," which is hereby incorporated by reference herein.

FIELD OF THE DISCLOSURE

The present disclosure generally relates to the field of semiconductor processing methods and systems, and to the field of electronic devices, and in particular, methods and systems suitable for forming layers comprising a metal oxide.

BACKGROUND OF THE DISCLOSURE

The scaling of semiconductor devices, such as, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode, and particularly threshold voltage shift materials, in aggressively scaled CMOS devices. Therefore, improved materials for gate electrodes are desired. In particular, such materials can include p-dipole shifting layers, and can be used for threshold voltage tuning.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

Deposition methods and methods for mitigating post-deposition agglomeration is provided. In various examples, a method can comprise providing a zinc precursor to a reaction chamber comprising a substrate disposed therein; providing an oxygen species to the reaction chamber; forming a zinc oxide layer on the substrate in response to providing the zinc precursor and providing the oxygen species; and/or mitigating agglomeration of the zinc oxide layer. Mitigating agglomeration of the zinc oxide layer can comprise forming a capping layer on an outer surface of the zinc oxide layer such that the outer surface of the zinc oxide layer is not exposed to ambient oxygen. In various examples, the zinc precursor can comprise diethylzinc. In various examples, the oxygen species can comprise water and/or ozone. In various examples, a deposition cycle can comprise providing the zinc precursor, providing the oxygen species, forming the zinc oxide layer, and forming the capping layer, wherein the deposition cycle is performed a number of times, forming a zinc oxide structure. In various examples, the zinc oxide structure can comprise between 10% and 40% by weight aluminum oxide.

In various examples, the method can further comprise providing a first purge gas to the reaction chamber after the providing the zinc precursor and before the providing the oxygen species to the reaction chamber. In various examples, the method can further comprise providing a second purge gas to the reaction chamber after providing the oxygen species.

In various examples, forming the capping layer can comprise providing an aluminum precursor to the reaction chamber; providing a second oxygen species to the reaction chamber; and/or forming an aluminum oxide layer on the outer surface of the zinc oxide layer, wherein the aluminum oxide layer is the capping layer. In various examples, the aluminum precursor can comprise trimethylaluminum. In various examples, the second oxygen species comprises at least one of water or ozone. In various examples, forming the capping layer can comprise providing a gallium precursor to the reaction chamber; providing a second oxygen species to the reaction chamber; and/or forming a gallium oxide layer on the outer surface of the zinc oxide layer, wherein the gallium oxide layer is the capping layer. In various examples, forming the capping layer can comprise providing a niobium precursor to the reaction chamber; providing a second oxygen species to the reaction chamber; and/or forming a niobium oxide layer on the outer surface of the zinc oxide layer, wherein the niobium oxide layer is the capping layer.

In various examples, a method can comprise providing a substrate into a reaction chamber; providing a zinc precursor to the reaction chamber; providing an oxygen species to the reaction chamber; forming a zinc oxide layer on the substrate in response to providing the zinc precursor and providing the oxygen species; and/or forming a capping layer on the zinc oxide layer such that the zinc oxide layer is sealed from exposure to ambient oxygen. In various examples, the zinc precursor can comprise diethylzinc. In various examples, the oxygen species comprises at least one of water or ozone. In various examples, wherein the method can further comprise providing a first purge gas to the reaction chamber after the providing the zinc precursor and before the providing the oxygen species to the reaction chamber. In various examples, the method can further comprise providing a second purge gas to the reaction chamber after the providing the oxygen species.

In various examples, forming the capping layer can comprise providing an aluminum precursor to the reaction chamber; providing a second oxygen species to the reaction chamber; and/or forming an aluminum oxide layer on the zinc oxide layer, wherein the aluminum oxide layer is the capping layer. In various examples, forming the capping layer can comprise providing a titanium precursor to the reaction chamber; providing a nitrogen species to the reaction chamber; and/or forming a titanium nitride layer on the zinc oxide layer, wherein the titanium nitride layer is the capping layer.

In various examples, a method can comprise providing a substrate into a first reaction chamber; providing a zinc precursor to the first reaction chamber; providing an oxygen species to the first reaction chamber; forming a zinc oxide layer on the substrate in response to providing the zinc precursor and providing the oxygen species; transferring the substrate to a second reaction chamber; and/or forming a capping layer on the zinc oxide layer in the second reaction chamber, such that the zinc oxide layer may be sealed from exposure to ambient oxygen. In various examples, forming the capping layer can comprise providing a titanium precursor to the reaction chamber; providing a nitrogen species to the reaction chamber; and/or forming a titanium nitride layer on the zinc oxide layer, wherein the titanium nitride layer is the capping layer. In various examples, the titanium precursor can comprise titanium carbonate. In various examples, the nitrogen species can comprise ammonia.

In various examples, mitigating post-deposition agglomeration of a zinc oxide layer can comprise doping the zinc oxide layer with another material, and/or applying a post-deposition treatment to the zinc oxide layer.

For the purpose of summarizing the disclosure and the advantages achieved over the prior art, certain objects and advantages of the disclosure have been described herein above. Of course, it is to be understood that not necessarily all such objects or advantages can be achieved in accordance with any particular embodiment or example of the disclosure. Thus, for example, those skilled in the art will recognize that the examples disclosed herein can be carried out in a manner that achieves or optimizes one advantage or group of advantages as taught or suggested herein without necessarily achieving other objects or advantages as can be taught or suggested herein.

All of these examples are intended to be within the scope of the disclosure. These and other embodiments will become readily apparent to those skilled in the art from the following detailed description of certain examples having reference to the attached figures, the disclosure not being limited to any particular example(s) discussed.

BRIEF DESCRIPTION OF THE DRAWING FIGURES

While the specification concludes with claims particularly pointing out and distinctly claiming what are regarded as embodiments or examples of the disclosure, the advantages of examples of the disclosure may be more readily ascertained from the description of certain examples of the disclosure when read in conjunction with the accompanying drawings. Elements with the like element numbering throughout the figures are intended to be the same.

DETAILED DESCRIPTION

Figure 1:
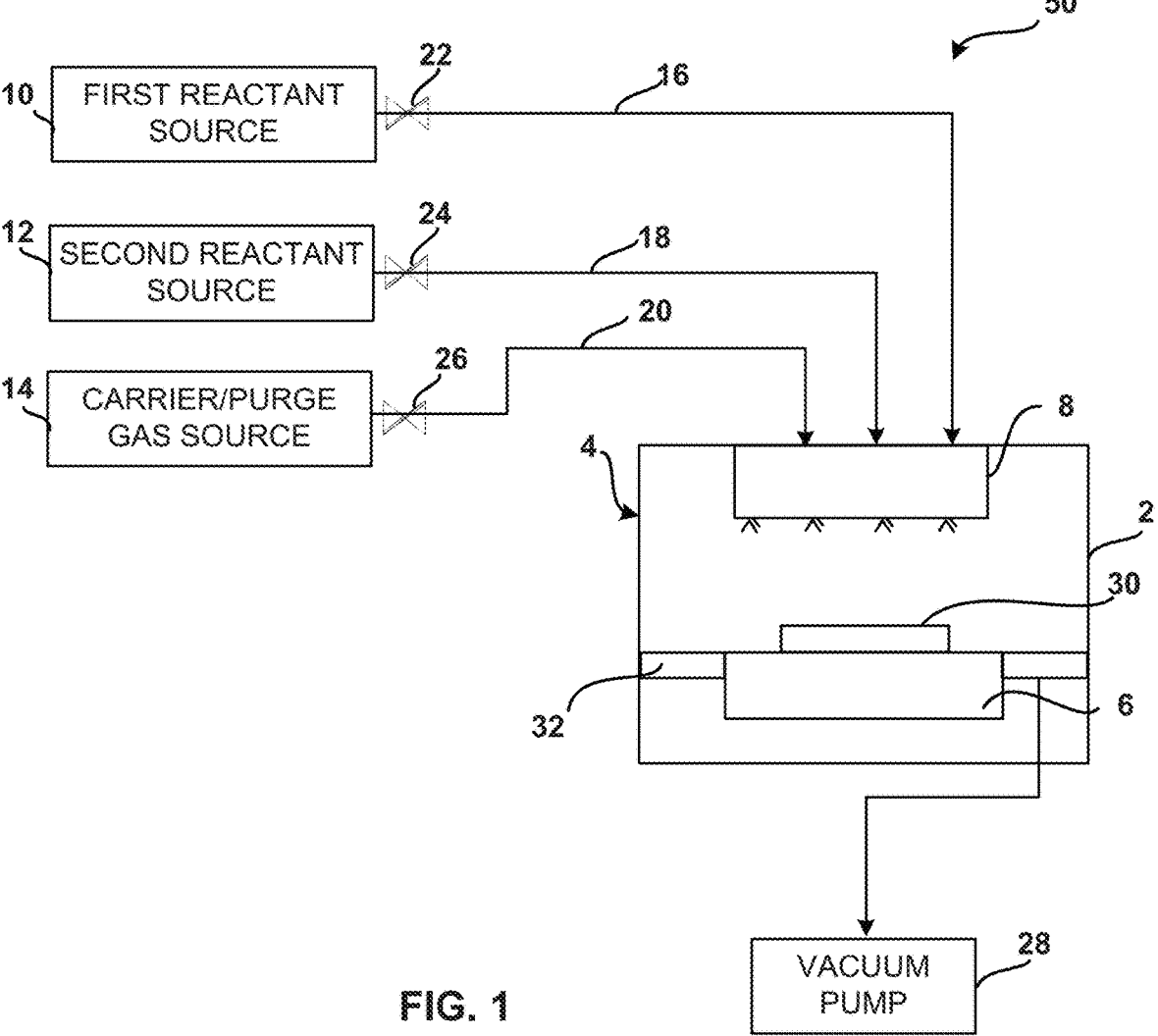
FIG. 1 illustrates a schematic diagram of a reactor system, in accordance with embodiments of the present technology.

The detailed description of various embodiments herein makes reference to the accompanying drawings, which show the exemplary embodiments by way of illustration. While these exemplary embodiments are described in sufficient detail to enable those skilled in the art to practice the disclosure, it should be understood that other examples may be realized and that logical, chemical, and/or mechanical changes may be made without departing from the spirit and scope of the disclosure. Thus, the detailed description herein is presented for purposes of illustration only and not of limitation. For example, the steps recited in any of the method or process descriptions can be executed in any combination and/or order and are not limited to the combination and/or order presented. Further, one or more steps from one of the disclosed methods or processes can be combined with one or more steps from another of the disclosed methods or processes in any suitable combination and/or order. Moreover, any of the functions or steps can be outsourced to or performed by one or more third parties. Furthermore, any reference to singular includes plural embodiments, and any reference to more than one component can include a singular embodiment.

Although certain embodiments and examples are disclosed below, it will be understood by those in the art that the disclosure extends beyond the specifically disclosed examples and/or uses of the disclosure and obvious modifications and equivalents thereof. Thus, it is intended that the scope of the disclosure should not be limited by the particular examples described herein.

The illustrations presented herein are not meant to be actual views of any particular material, apparatus, structure, or device, but are merely representations that are used to describe embodiments of the disclosure.

As used herein, the term "substrate" can refer to any underlying material or materials that may be used, or upon which, a device, a circuit, or a film/layer may be formed.

As used herein, the term "atomic layer deposition" (ALD) can refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) can subsequently be introduced into the process chamber for use in converting the chemisorbed precursor to the desired material on the deposition surface. Typically, this reactant is capable of further reaction with the precursor. Further, purging steps can also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) can refer to any process wherein a substrate is exposed to one or more volatile precursors, which react and/or decompose on a substrate surface to produce a desired deposition.

As used herein, the terms "layer," "film," and/or "thin film" can refer to any continuous or non-continuous structures and material deposited by the methods disclosed herein. For example, "layer," "film," and/or "thin film" could include 2D materials, nanorods, nanotubes, or nanoparticles or even partial or full molecular layers or partial or full atomic layers or clusters of atoms and/or molecules. "Layer," "film," and/or "thin film" can comprise material or a layer with pinholes, but still be at least partially continuous.

Further, in this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, or the like. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Reactor systems used for ALD, CVD, and/or the like, may be used for a variety of applications, including depositing and etching materials on a substrate surface. In various embodiments, a reactor system 50 can comprise a reaction chamber 4, a susceptor 6 to hold a substrate 30 during processing, a fluid distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20, and valves or controllers 22-26. Reactant gases or other materials from reactant sources 10, 12 can be applied to substrate 30 in reaction chamber 4. A purge gas from purge gas source 14 can be flowed to and through reaction chamber 4 to remove any excess reactant or other undesired materials from reaction chamber 4. System 50 can also comprise a vacuum source 28 fluidly coupled to the reaction chamber 4, which can be configured to evacuate reactants, a purge gas, or other materials out of reaction chamber 4.

In various examples, a reactor system can comprise multiple reaction chambers. For example, in reactor system 200, shown in FIG. 2, a number of reaction chambers 204 (each of which can be an example of reaction chamber 4 in FIG. 1) can be disposed around and/or coupled to a transfer chamber 80 comprising a transfer tool 285 for transferring substrates between reaction chambers 204. Substrates can be transferred from a load lock chamber 212 and between reaction chambers 280 (e.g., through transfer chamber 280). For example, a substrate can be disposed in different chambers for different steps in a deposition process.

Figure 3A:
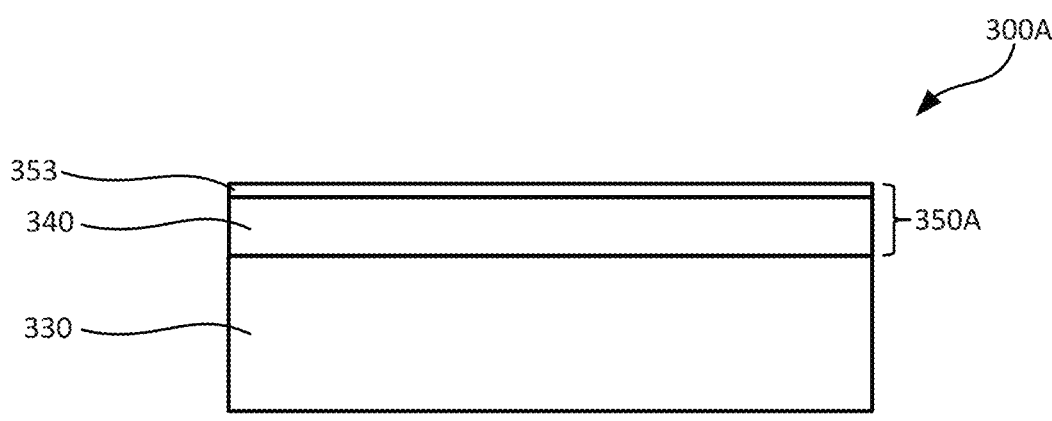
FIGS. 3A and 3B illustrate device structures, in accordance with embodiments of the present technology.
Figure 3B:
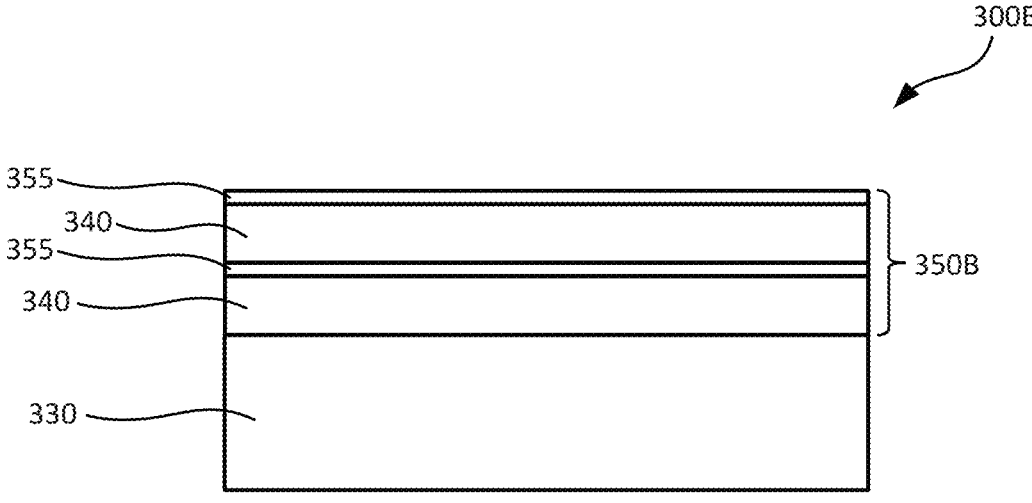
Figure 4:
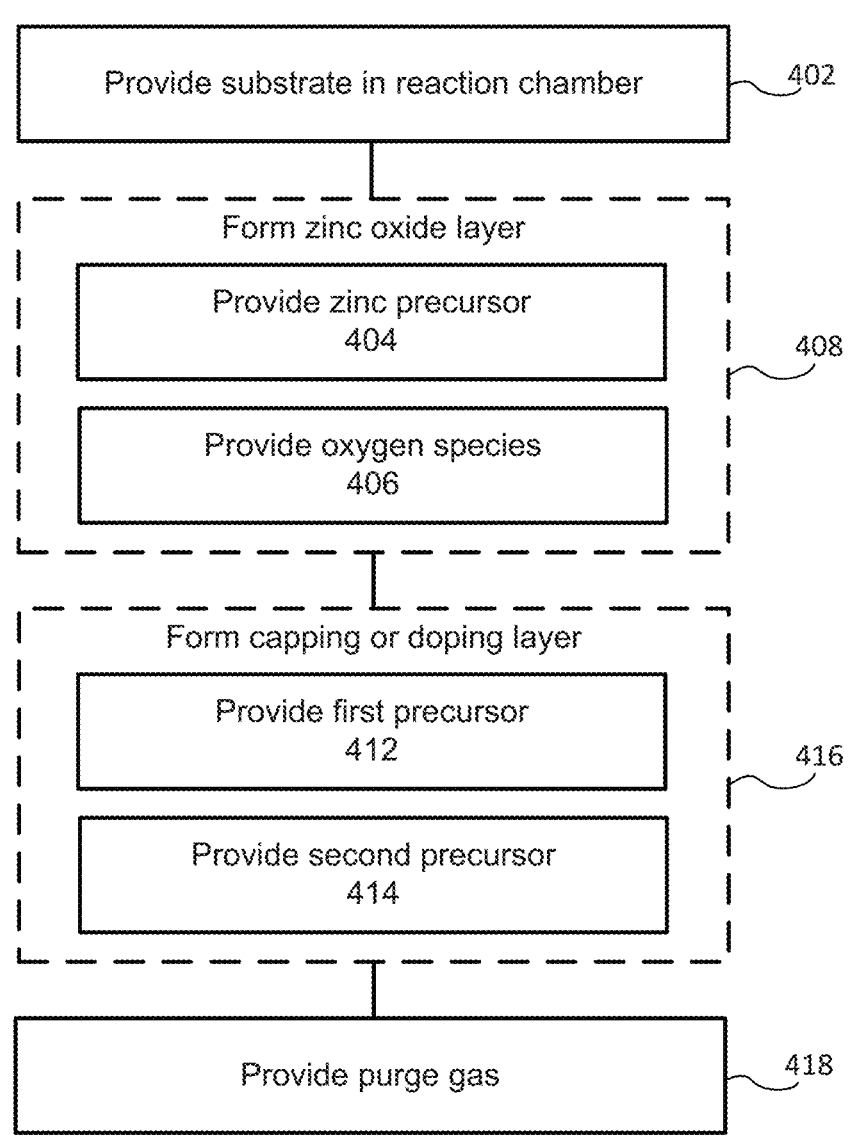
FIG. 4 illustrates a deposition method, in accordance with embodiments of the present technology.

FIG. 4 depicts a method 400 of depositing layers on a substrate to form a device structure, such as device structures 300A and 300B illustrated in FIGS. 3A and 3B, respectively. Device structures 300A and/or 300B can be gate electrode structures suitable for NMOS, PMOS, and/or CMOS devices, such as for uses as a p-dipole shifter in a gate, source, or drain electrode of a metal oxide semiconductor. However, unless otherwise noted, the presently described methods are not limited to such applications.

Figure 2:
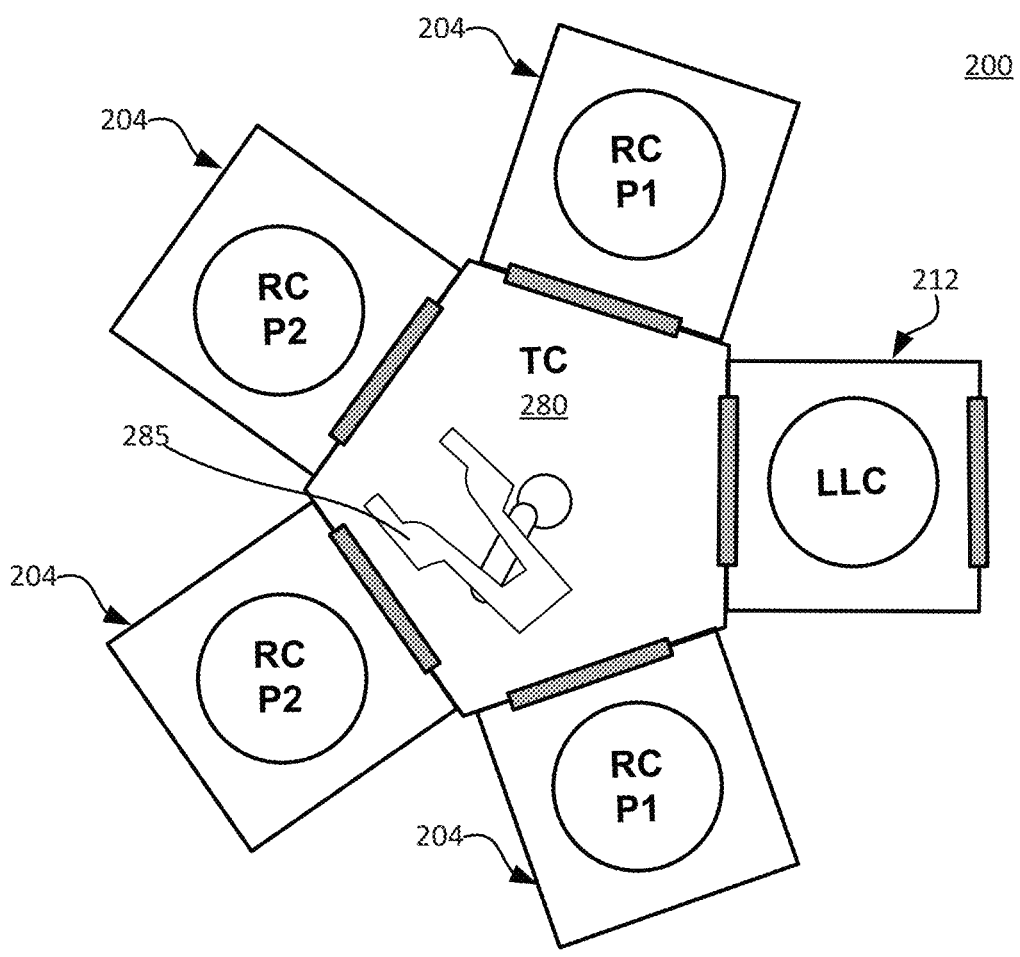
FIG. 2 illustrates a schematic diagram of a reactor system having multiple reaction chambers, in accordance with embodiments of the present technology.

With combined reference to FIGS. 3A, 3B, and 4, method 400 can comprise providing a substrate 330 in a reaction chamber (step 402) (e.g., reaction chamber 4 in FIG. 1). Substrate 330 can be disposed on a susceptor (e.g., susceptor 6 in FIG. 1) for processing. In an exemplary embodiment, the method may further comprise forming a zinc oxide layer (step 408). In various examples, forming the zinc oxide layer may comprise providing a zinc precursor (step 404) to the reaction chamber. Providing a zinc precursor can comprise providing the zinc precursor through a showerhead to the substrate, or through a crossflow fluid distribution system. The zinc precursor can be pulsed into the reaction chamber for any suitable duration (e.g., for pulse times of between 0.05 to 30 seconds). The pressure within the reaction chamber during provision of the zinc precursor can be any suitable pressure, such as between 1 and 10 Torr. In various examples, the zinc precursor can comprise any suitable zinc compound, such as diethylzinc and/or dimethylzinc.

In various examples, forming the zinc oxide layer may further comprise providing an oxygen species (step 406) to the reaction chamber. The oxygen species can be provided through a showerhead to the substrate, or through a crossflow fluid distribution system. The oxygen species can be pulsed into the reaction chamber for any suitable duration (e.g., for pulse times of between 0.05 to 30 seconds). In various examples, an oxygen species can be continuously provided to a reaction chamber. The pressure within the reaction chamber during provision of the oxygen species can be any suitable pressure, such as between 1 and 10 Torr. In various examples, the oxygen species can comprise any suitable compound comprising oxygen and/or oxidizing compound, such as water ($H_2O$), ozone ($O_3$), hydrogen peroxide ($H_2O_2$), deuterium oxide ($D_2O$), nitrous oxide ($N_2O$), nitrogen dioxide ($NO_2$), an alcohol (e.g., tertbutyl alcohol).

The temperature during the steps to form the zinc oxide layer can be between 150° C. and 300° C., or about 200° C. ("about" in this context means plus or minus 50° C.).

The steps of providing the zinc precursor and providing the oxygen species can be performed in any suitable order. In various examples, the zinc precursor can be provided to the reaction chamber before the oxygen species. In other examples, the oxygen species can be provided to the reaction chamber before the zinc precursor. In various examples, the step of providing a zinc precursor (step 404) and/or the step of providing an oxygen species (step 406) can be repeated any suitable number of times before a subsequent step takes place. For example, providing a zinc precursor (step 404) can be repeated multiple times before or after providing an oxygen species (step 406) to the reaction chamber, and/or providing an oxygen species (step 406) can be repeated multiple times before or after providing a zinc precursor (step 404).

In various examples, the steps of providing the zinc precursor and providing the oxygen species can be separated by a purge gas. Thus, after providing the zinc precursor (step 404) to the reaction chamber, a purge gas can be provided (step 418) to the reaction chamber to remove excess precursor, byproducts, or other unwanted materials. In examples in which the oxygen species is provided to the reaction chamber before the zinc precursor, the purge gas can be provided (step 418) to the reaction chamber after providing the oxygen species (step 406). In various examples, a purge gas can be provided (step 418) after each step (e.g., after providing the zinc precursor and providing the oxygen species, regardless of the order) and/or after deposition of the zinc oxide layer or after a zinc oxide deposition cycle (i.e., a post-deposition purge step). A purge gas can comprise any suitable gas, such an inert or nonreactive gas, such as helium, neon, argon, krypton, xenon, and/or nitrogen ($N_2$).

Steps 404 and 406, and any other steps involved in forming a zinc oxide layer (including purge steps) (collectively, a "zinc oxide deposition cycle") can be repeated any suitable number of times to achieve a desired thickness of the zinc oxide layer on the substrate. For example, a zinc oxide deposition cycle can be repeated until the zinc oxide layer is between 0.5 and 10 angstroms thick, or about 10 angstroms thick ("about" in this context means plus or minus two angstroms).

After deposition of a zinc oxide layer, in response to being exposed to ambient fluid (e.g., ambient gas or air), the zinc oxide layer may agglomerate and form clumps of material in the zinc oxide (e.g., causing the zinc oxide layer to become rough). Thus, the post-deposition agglomeration can cause a lack of uniformity across the zinc oxide layer, which can have negative effects on the performance of the resulting device. Without being bound by theory, such agglomeration may be due to oxygen in the ambient air reacting with the zinc oxide layer present on the substrate.

In various examples, the method 400 may further comprise forming a capping layer 353 (step 416) on an outer surface of the zinc oxide layer to mitigate agglomeration of the zinc oxide layer. Such a capping layer can be configured to shield or seal the zinc oxide layer from ambient fluid (e.g., oxygen in the ambient air) such that the zinc oxide layer is not exposed to the ambient fluid.

Forming the capping layer may comprise providing a first precursor to the reaction chamber (step 412) after formation of a zinc oxide layer. The first precursor can be provided through a showerhead to the substrate, or through a cross-flow fluid distribution system. The first precursor can be pulsed into the reaction chamber for any suitable duration (e.g., for pulse times of between 0.05 to 30 seconds). The pressure within the reaction chamber during provision of the first precursor can be any suitable pressure, such as between 1 and 10 Torr.

In various examples, forming the capping layer may further comprises providing a second precursor (step 414) to the reaction chamber. The second precursor can be provided through a showerhead to the substrate, or through a cross-flow fluid distribution system. The second precursor can be pulsed into the reaction chamber. The pressure within the reaction chamber during provision of the second precursor can be any suitable pressure, such as between 1 and 10 Torr.

The steps of providing the first precursor and providing the second precursor can be performed in any suitable order. In various examples, the first precursor can be provided to the reaction chamber before the second precursor. In other examples, the second precursor can be provided to the reaction chamber before the first precursor. In various examples, the step of providing the first precursor (step 412) and/or the step of providing the second precursor (step 414) can be repeated any suitable number of times before a subsequent step takes place. For example, providing the first precursor (step 412) can be repeated multiple times before or after providing the second precursor (step 414) to the reaction chamber, and/or providing the second precursor (step 414) can be repeated multiple times before or after providing the first precursor (step 412).

In various examples, the steps of providing the first precursor and providing the second precursor can be separated by a purge gas. Thus, after providing the first precursor (step 412) to the reaction chamber, a purge gas can be provided (step 418) to the reaction chamber to remove excess precursor, byproducts, and/or other unwanted materials. In examples in which the second precursor is provided to the reaction chamber before the first precursor, the purge gas can be provided to the reaction chamber after providing the second precursor (step 414). In various examples, a purge gas can be provided (step 418) after each step (e.g., after providing the first precursor and providing the second precursor, regardless of the order).

Steps 412 and 414, and any other steps involved in forming the capping layer (e.g., purge steps) can be repeated any suitable number of times to achieve a desired thickness of the capping layer on the substrate. For example, such steps can be repeated until the capping layer is between one and ten angstroms thick, or about three angstroms thick ("about" in this context means plus or minus one angstrom).

In various examples, the capping layer may cover an outer surface of the zinc oxide layer (i.e., the surface opposite the substrate) such that the outer surface of the zinc oxide layer is not exposed to ambient fluid (e.g., oxygen in ambient air) (such as the layer arrangement of device structure 350A shown in FIG. 3A). In various examples, the capping layer may encapsulate the entire zinc oxide layer (e.g., an outer surface and side surfaces of the zinc oxide layer) such that the zinc oxide layer is not exposed to ambient fluid. In such examples, the zinc oxide layer can be completely surrounded by the capping layer and the substrate. Therefore, the capping layer can be configured to seal at least a portion of the zinc oxide layer from being exposed to ambient fluid.

The capping layer can comprise any suitable compound and/or material. In various examples, the capping layer can comprise an oxide layer and/or metal oxide layer. For example, the capping layer can comprise aluminum oxide (i.e., an aluminum oxide layer can be disposed on the zinc oxide layer as a capping layer). In such examples, the first precursor can comprise an aluminum precursor, such as trimethylaluminum, triethylaluminium, and/or aluminum chloride ($AlCl_3$). As another example, the capping layer can comprise gallium oxide (i.e., a gallium oxide layer can be disposed on the zinc oxide layer as a capping layer). In such examples, the first precursor can n comprise a gallium precursor, such as tris(dimethylamino)gallium, tris(dimethylamido)gallium, triethylgallium, and/or trimethylgallium. As another example, the capping layer can comprise niobium oxide (i.e., a niobium oxide layer can be disposed on the zinc oxide layer as a capping layer). In such examples, the first precursor can comprise a niobium precursor, such as niobium (V) chloride ($NbCl_5$). In such examples, the second precursor can comprise a second oxygen species, such as water ($H_2O$) or ozone ($O_3$). The temperature in the reaction chamber(s) during formation of a capping layer comprising a metal oxide can be between 150° C. and 300° C., or about 200° C. ("about" in this context means plus or minus 50° C.).

In various examples, the capping layer can comprise a nitride layer and/or metal nitride layer. For example, the capping layer can comprise titanium nitride (i.e., a titanium nitride layer can be disposed on the zinc oxide layer as a capping layer). In such examples, the first precursor can comprise a titanium precursor, such as titanium carbonate ($TiCO_3$), titanium carbide, titanium chloride ($TiCl_4$), titanium methoxide (TMOT), and/or tetrakis(dimethylamido) titanium (TDMAT). In such examples, the second precursor can comprise any suitable compound comprising nitrogen, such as ammonia ($NH_3$) and/or hydrazine ($N_2H_4$). The temperature in the reaction chamber(s) during formation of a capping layer comprising a nitride can be between 350° C. and 500° ° C., or about 450° C. ("about" in this context means plus or minus 50° C.).

The pressure within the reaction chamber(s) during formation of the capping layer provision of the oxygen species can be any suitable pressure, such as between 1 and 10 Torr.

In various examples, a substrate can remain in a single reaction chamber for one or more process steps discussed herein, or a substrate can be moved between reaction chambers for different process steps. For example, a substrate can remain in a single reaction chamber for a zinc oxide deposition cycle (e.g., steps 404, 406, and any purge steps). As another example, the substrate can remain in a single reaction chamber for zinc oxide layer deposition and capping layer deposition in examples in which the capping layer comprises a metal oxide.

In examples in which the capping layer comprises a nitride, a substrate can be disposed in one reaction chamber for steps for forming a zinc oxide layer, and transferred to a different reaction chamber (such as in a reactor system having multiple reaction chambers, e.g., reactor system 200) for steps for forming a capping layer. Therefore, in various examples, utilizing a capping layer comprising a metal oxide can be more efficient than utilizing a capping layer comprising a nitride because of a lower processing temperature and the use of a single reaction chamber for more processing steps (e.g., causing increased output and/or less energy usage). Additionally, zinc oxide can be less stable at elevated temperatures (e.g., the temperatures of forming a capping layer comprising nitride), which could lead to imperfections or other undesirable properties in one or more layers of the resulting device.

Forming a capping layer on a zinc oxide layer, in accordance with various examples, demonstrated significant agglomeration mitigation in the zinc oxide layer. Agglomeration can be the result of surface migration in the zinc oxide layer. In an example of a zinc oxide layer disposed on a substrate without a capping layer, surface roughness of the zinc oxide layer had a roughness (Rq, RMS (root mean square)) of 0.327 nanometers (nm) after two days. The amount of surface roughness is an indicator of the migration and/or agglomeration in the zinc oxide layer—greater surface roughness indicates greater migration and/or agglomeration. In an example of a zinc oxide layer disposed on a substrate with an aluminum oxide capping layer disposed on the zinc oxide layer (e.g., formed using an aluminum precursor comprising trimethylaluminum), the zinc oxide layer had a roughness (Rq, RMS) of 0.15 nm after two days and 0.14 nm after nine days. Therefore, the aluminum oxide capping layer in these examples significantly improved the undesired agglomeration in a zinc oxide layer (achieving surface roughness of half the value, with little or no migration or agglomeration), compared to a zinc oxide layer without a capping layer, including keeping migration and/or agglomeration steady (or even decreasing) after nine days.

In various examples, to mitigate agglomeration of a zinc oxide layer, the zinc oxide layer can be doped with another material. For example, another metal oxide can be added to the zinc oxide layer as a dopant, such as aluminum oxide, gallium oxide, niobium oxide, and/or the like. Different dopants can have different benefits. For example, niobium oxide may be neutral with regard to threshold voltage shift. Therefore, with niobium oxide, the threshold voltage shift caused by the doped zinc oxide film can be better controlled.

A dopant can be included in a zinc oxide layer on a substrate in any suitable manner. In various examples, a dopant can be provided to the reaction chamber before, after, and/or with one or more of the zinc precursor, an oxygen species, and/or a purge or carrier gas, or in any other suitable manner.

In various examples, a dopant can be provided to a zinc oxide layer or structure by providing a layer of another material between layers of zinc oxide within a zinc oxide structure. For example, after each zinc oxide deposition cycle (e.g., steps 404-408 in method 400, and any purge steps) or repetition thereof to form a desired thickness of the zinc oxide layer (e.g., zinc oxide layer 340), a doping layer can be formed (step 416) on the deposited zinc oxide layer (e.g., doping layer 355). A doping layer can be formed via steps 412 and 414, and any purge steps (collectively, a "doping layer deposition cycle"), as discussed herein, similar to the formation of a capping layer (thus, the discussion of steps 412 and 414 above related to the capping layer, including materials comprised therein and method of formation, is also applicable to formation of a doping layer). A doping layer deposition cycle can be repeated any suitable number of times to achieve a desired thickness of a doping layer. Thus, zinc oxide layers and doping layers can alternate in a device structure in any suitable arrangement (e.g., as shown in zinc oxide device structure 350B in FIG. 3B). For example, a zinc oxide layer deposition and a doping layer deposition collectively may be a deposition cycle, and a deposition cycle may be repeated a number of times to form a zinc oxide structure comprising a dopant. As another example, zinc oxide layers can be deposited on the substrate to a thickness of about three angstroms, and doping layers can be deposited to a thickness of about one angstrom ("about" in this context means plus or minus 0.5 angstrom).

In various examples, a zinc oxide device structure comprising a dopant can comprise between 10 and 90 weight percent zinc oxide, and between 90 and 10 weight percent dopant. For example, a zinc oxide device structure can comprise about 90 weight percent zinc oxide and about 10 weight percent dopant, about 80 weight percent zinc oxide and about 20 weight percent dopant, about 70 weight percent zinc oxide and about 30 weight percent dopant, or about 60 weight percent zinc oxide and about 40 weight percent dopant ("about" in this context means plus or minus 10 weight percent).

Figure 5:
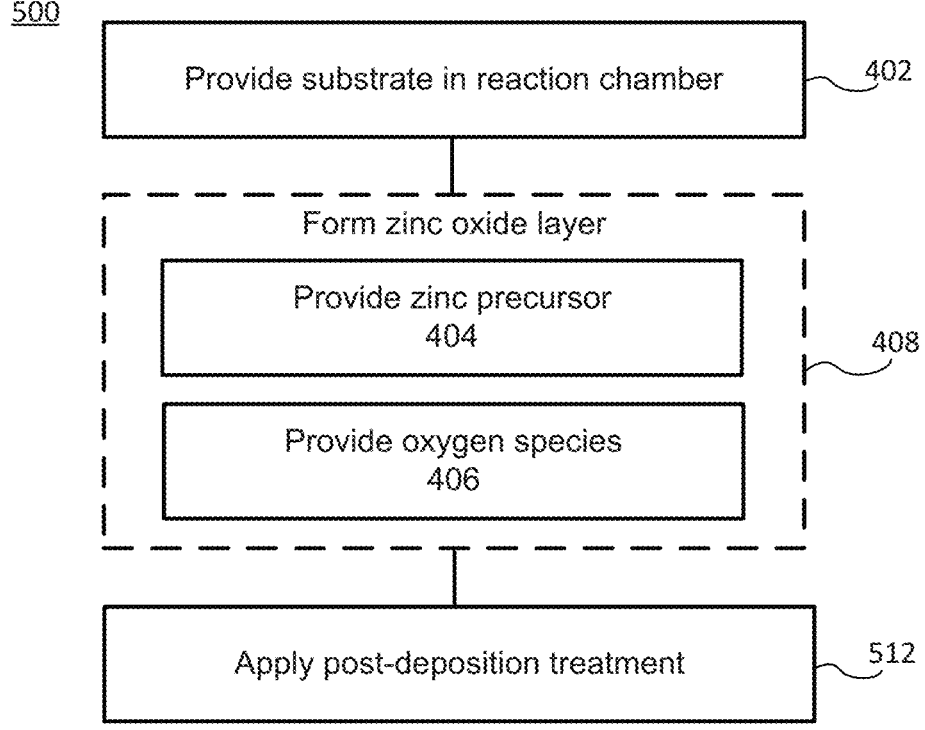
FIG. 5 illustrates a deposition method, in accordance with embodiments of the present technology.

With additional reference to method 500 in FIG. 5, in various examples, the method 500 may comprise forming the zinc oxide layer (step 408) and treating the zinc oxide layer with a post-deposition treatment (step 512) to mitigate agglomeration of a zinc oxide layer. For example, a zinc oxide layer can be deposited onto a substrate, and then a post-treatment can be provided to the reaction chamber. The post-treatment can comprise any suitable material, such as a nitrogen compound and/or nitrogen plasma. For example, the post-treatment material can comprise ammonia and/or an excited nitrogen species. Without being bound by theory, treatment of a zinc oxide layer with a post-treatment, in accordance with various embodiments, may cause outward-facing oxygen groups from the zinc oxide layer to be replaced by outward-facing nitrogen groups. Thus, ambient fluid (e.g., oxygen in ambient air) may be less likely to react with the outward-facing nitrogen groups than outward-facing oxygen groups, mitigating the risk of agglomeration of the zinc oxide layer.

Application of the post-deposition treatment (step 512) can be conducted with any suitable frequency under any suitable conditions. For example, the temperature in the reaction chamber(s) during a post-treatment step can be between 350° C. and 500° ° C., or about 450° C. ("about" in this context means plus or minus 50° C.). The pressure in a reaction chamber(s) during a post-treatment step can be between 1 and 10 Torr. A post-treatment can be applied after every zinc oxide deposition cycle, or after multiple zinc oxide deposition cycles, or repeated post-treatments can be conducted.

A layer comprising zinc oxide can be advantageous in a gate electrode or other device over other layers used previously (e.g., as a p-dipole layer). For example, aluminum oxide has previously been used as a p-dipole layer in devices. However, aluminum oxide is a relatively weak threshold voltage shifter, while zinc oxide is a relatively stronger threshold voltage shifter. Also, aluminum oxide has equivalent oxide thickness penalty, while zinc oxide comprises little or no equivalent oxide thickness penalty.

Although exemplary embodiments of the present disclosure are set forth herein, it should be appreciated that the disclosure is not so limited. For example, although reactor and contaminant trap systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A method, comprising:
   providing a zinc precursor to a reaction chamber comprising a substrate disposed therein;
   providing an oxygen species to the reaction chamber;
   forming a zinc oxide layer on the substrate in response to the providing the zinc precursor and the providing the oxygen species; and
   mitigating agglomeration of the zinc oxide layer comprising forming a capping layer directly on an outer surface of the zinc oxide layer such that the outer surface of the zinc oxide layer is not exposed to ambient oxygen.

2. The method of claim 1, wherein the zinc precursor comprises diethylzinc.

3. The method of claim 2, wherein the oxygen species comprises at least one of water or ozone.

4. The method of claim 1, further comprising providing a first purge gas to the reaction chamber after the providing the zinc precursor and before the providing the oxygen species to the reaction chamber.

5. The method of claim 4, further comprising providing a second purge gas to the reaction chamber after the providing the oxygen species.

6. The method of claim 1, wherein the forming the capping layer comprises:
   providing an aluminum precursor to the reaction chamber;
   providing a second oxygen species to the reaction chamber; and
   forming an aluminum oxide layer directly on the outer surface of the zinc oxide layer, wherein the aluminum oxide layer is the capping layer.

7. The method of claim 6, wherein the aluminum precursor comprises trimethylaluminum, and wherein the second oxygen species comprises at least one of water or ozone.

8. The method of claim 6, wherein a deposition cycle comprises the providing the zinc precursor, the providing the oxygen species, the forming the zinc oxide layer, and the forming the capping layer, wherein the deposition cycle is performed a number of times, forming a zinc oxide structure.

9. The method of claim 8, wherein the zinc oxide structure comprises between 10% and 40% by weight aluminum oxide.

10. The method of claim 1, wherein the forming the capping layer comprises:
   providing a gallium precursor to the reaction chamber;
   providing a second oxygen species to the reaction chamber; and
   forming a gallium oxide layer directly on the outer surface of the zinc oxide layer, wherein the gallium oxide layer is the capping layer.

11. The method of claim 1, wherein the forming the capping layer comprises:
   providing a niobium precursor to the reaction chamber;
   providing a second oxygen species to the reaction chamber; and
   forming a niobium oxide layer directly on the outer surface of the zinc oxide layer, wherein the niobium oxide layer is the capping layer.

12. A method, comprising:
   providing a substrate into a reaction chamber;
   providing a zinc precursor to the reaction chamber;
   providing an oxygen species to the reaction chamber;
   forming a zinc oxide layer on the substrate in response to the providing the zinc precursor and the providing the oxygen species; and
   forming a capping layer on the zinc oxide layer such that the zinc oxide layer is sealed from exposure to ambient oxygen.

13. The method of claim 12, wherein the zinc precursor comprises diethylzinc, and wherein the oxygen species comprises at least one of water or ozone.

14. The method of claim 12, further comprising providing a first purge gas to the reaction chamber after the providing the zinc precursor and before the providing the oxygen species to the reaction chamber.

15. The method of claim 12, wherein the capping layer encapsulates an outer surface and side surfaces of the zinc oxide layer such that the zinc oxide layer is sealed from exposure to ambient oxygen.

16. The method of claim 12, wherein the forming the capping layer comprises:
   providing an aluminum precursor to the reaction chamber;
   providing a second oxygen species to the reaction chamber; and
   forming an aluminum oxide layer on the zinc oxide layer, wherein the aluminum oxide layer is the capping layer.

17. The method of claim 12, wherein the forming the capping layer comprises:
   providing a titanium precursor to the reaction chamber;
   providing a nitrogen species to the reaction chamber; and
   forming a titanium nitride layer on the zinc oxide layer, wherein the titanium nitride layer is the capping layer.

18. A method, comprising:
   providing a substrate into a first reaction chamber;
   providing a zinc precursor to the first reaction chamber;
   providing an oxygen species to the first reaction chamber;
   forming a zinc oxide layer on the substrate in response to the providing the zinc precursor and the providing the oxygen species;
   transferring the substrate to a second reaction chamber; and
   forming a capping layer on the zinc oxide layer in the second reaction chamber, such that the zinc oxide layer is sealed from exposure to ambient oxygen.

19. The method of claim 18, wherein the forming the capping layer comprises:
   providing a titanium precursor to the reaction chamber;
   providing a nitrogen species to the reaction chamber; and
   forming a titanium nitride layer on the zinc oxide layer, wherein the titanium nitride layer is the capping layer.

20. The method of claim 19, wherein the titanium precursor comprises titanium carbonate, and wherein the nitrogen species comprises ammonia.

* * * * *